United States Patent
Baek et al.

[11] Patent Number: 5,187,548
[45] Date of Patent: Feb. 16, 1993

[54] STACKED CAPACITOR OF A DRAM CELL WITH FIN-SHAPED ELECTRODES HAVING SUPPORTING LAYERS

[75] Inventors: Won-Shik Baek; Kyu-Hyun Choi; Dong-Joo Bae, all of Seoul, Rep. of Korea

[73] Assignee: Samsung Electronics Co., Ltd., Kyungki-do, Rep. of Korea

[21] Appl. No.: 589,621

[22] Filed: Sep. 28, 1990

[30] Foreign Application Priority Data

Jun. 29, 1990 [KR] Rep. of Korea ............... 1990/9726

[51] Int. Cl.⁵ ............ H01L 29/68; H01L 27/02
[52] U.S. Cl. .................................... 257/308
[58] Field of Search ........... 357/23.6, 51; 437/52

[56] References Cited

U.S. PATENT DOCUMENTS

| | | | |
|---|---|---|---|
| 4,700,457 | 10/1987 | Matsukawa | 437/52 |
| 4,953,126 | 8/1990 | Ema | 365/182 |
| 4,974,040 | 11/1990 | Taguchi et al. | 357/23.6 |
| 4,985,718 | 1/1991 | Ishijima | 357/23.6 |
| 5,006,481 | 4/1991 | Chan et al. | 357/23.6 |
| 5,103,275 | 4/1992 | Miura et al. | 357/23.6 |

FOREIGN PATENT DOCUMENTS

59-231851 12/1984 Japan .................. 357/23.6

Primary Examiner—Rolf Hille
Assistant Examiner—Robert Limanek
Attorney, Agent, or Firm—Robert E. Bushnell

[57] ABSTRACT

There is disclosed a stacked capacitor comprising a fin-shaped storage electrode of multiple polysilicon layers with supporting layers therebetween so as to compensate for the structural weakness of the fin-shaped storage electrode.

17 Claims, 12 Drawing Sheets

STACKED CAPACITOR OF A DRAM CELL WITH FIN-SHAPED ELECTRODES HAVING SUPPORTING LAYERS

BACKGROUND OF THE INVENTION

The present invention relates to a capacitor of a semiconductor memory device, and particularly to a stacked capacitor of a DRAM and a process therefor.

The memory capacity of a semiconductor memory device, particularly of a DRAM cell, is determined by the capacity of the capacitor constituting the memory cell. Meanwhile, as the memory device gets more and more highly integrated and thus smaller in size, the area occupied by each cell is reduced, and thus the capacity of the capacitor has to suffer structural reduction. Hence, it is necessary for the capacitor to have an adequately large capacity even if the size of a memory cell gets smaller. A typical example of DRAM cell capacitors with a large capacity more than 4 mega bits is a stacked structure, wherein the storage electrodes are stacked on the substrate, so that the expanded surface areas of the storage electrodes are used to increase the capacity of the capacitor.

Referring to FIG. 1 for illustrating the cross section of a conventionally improved stacked capacitor, on the substrate 1 having an element isolating oxide layer 2, a source and a drain regions 3 and 4, a word and a bit lines 5 and 10, and an insulating layer 6 is there formed a capacitor including a fin-shaped storage electrode 7 contacting the source region 3, a dielectric layer 8 and a plate electrode 9. Over the whole surface of the substrate 1 is laid element protecting layer 11. The fin-shaped storage electrode 7 is formed by alternately depositing a plurality of polysilicon layers and a plurality of oxide layers on the substrate and etching them, and thereafter the whole substrate is immersed in an oxide etching solution to remove all the oxide layers remaining between the polysilicon layers. Then, the dielectric layer 8 and the plate electrode 9 are formed. However, in this case, the wing portions 12 and 13 of the storage electrode is susceptible to be broken when the substrate is immersed in the etching solution. Namely, if all the oxide layers between the polysilicon layers are removed, the wing portions 12 and 13 of the storage electrode 7 are suspended without any supporting layers, thus resulting in weakening of the wing portions. This drawback decreases the reliability of the process as well as causes unstable structure of a stacked capacitor formed of multiple polysilicon layers.

SUMMARY OF THE INVENTION

It is accordingly an object of the present invention to provide a stacked capacitor of a stable structure for a DRAM cell.

It is another object of the present invention to provide a method for securing the reliability and stability of the process and increasing the capacity of a capacitor for a DRAM cell.

According to one aspect of the present invention, a stacked capacitor comprises a storage electrode of multiple polysilicon layers with a supporting layer therebetween.

According to another aspect of the present invention, only portions of oxide layers between multiple polysilicon layers are etched to form supporting layers.

The present invention will now be described with reference to the drawings attached only by way of example.

BRIEF DESCRIPTION OF THE ATTACHED DRAWINGS

For a better understanding of the invention and to show how the same may be carried into effect, reference will now be made, by way of example, to the accompanying diagrammatic drawings, in which.

DETAILED DESCRIPTION OF THE PREFERRED EMBODIMENTS

Figure 1:
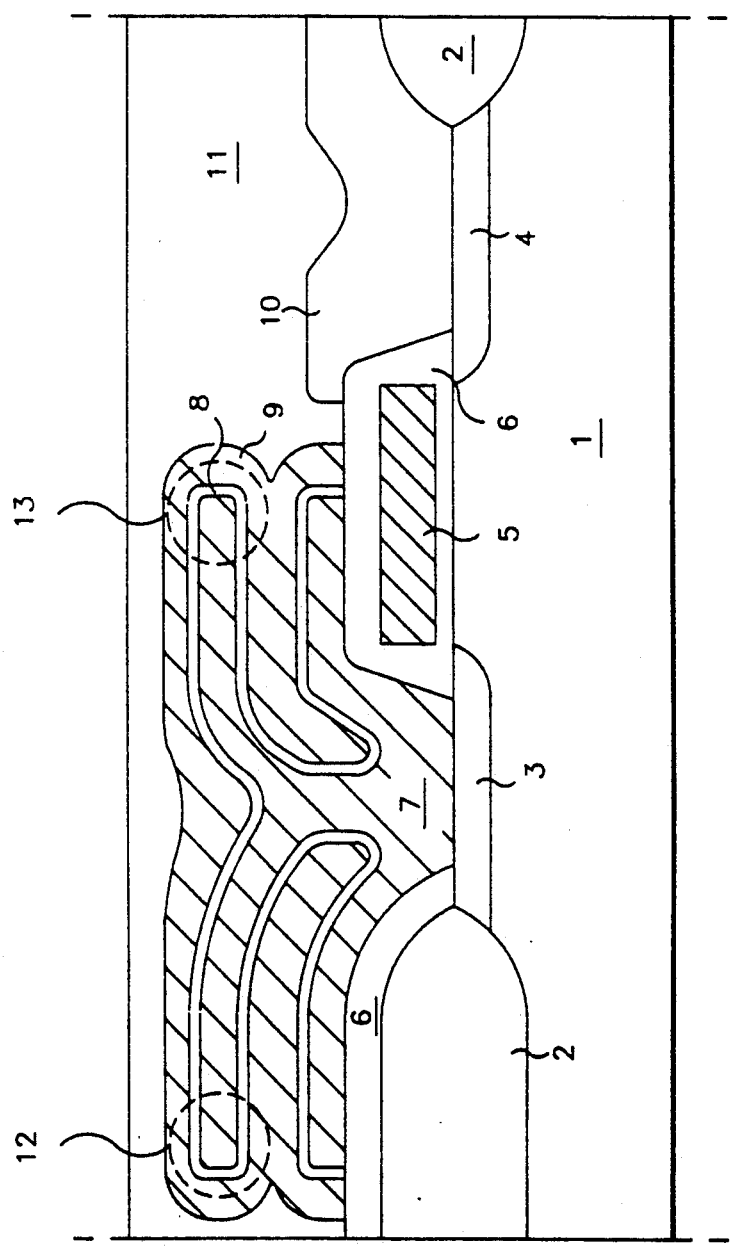
FIG. 1 is a cross sectional view of a conventional stacked capacitor.
Figure 2:
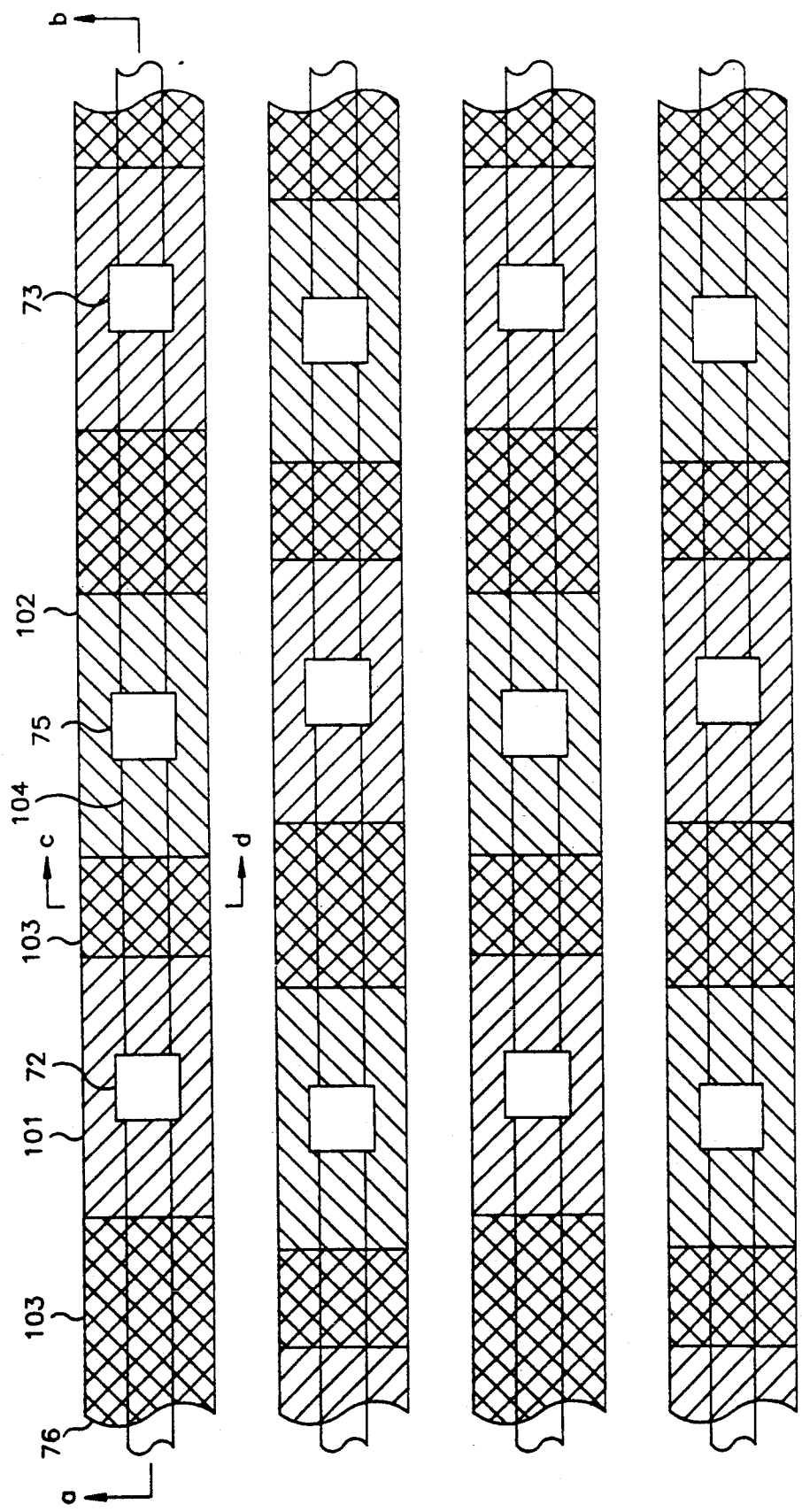
FIG. 2 is a plane view for illustrating the pattern of an inventive stacked capacitor.

Referring to FIG. 2 for illustrating the pattern of forming the inventive stacked capacitor, the adjacent polysilicon layers 101 and 102 forming the storage electrode of a capacitor overlap each other, showing an overlap 103. The regions of the polysilicon layers except the overlap have contact openings 72, 73, 75 for connecting the lowermost polysilicon layers with the sources of MOS transistors. In the central regions of the polysilicon layers 101 and 102 is extended an oxide layer 104 in parallel thereto, which layer is interposed between the polysilicon layers so as to support them. After a plurality of polysilicon layers are deposited on the substrate, a photoresist pattern 76 is laid over them to form the pattern of the storage electrode. The photoresist pattern is used in the procedure which will be described below with reference to FIG. 3.

Figure 3:
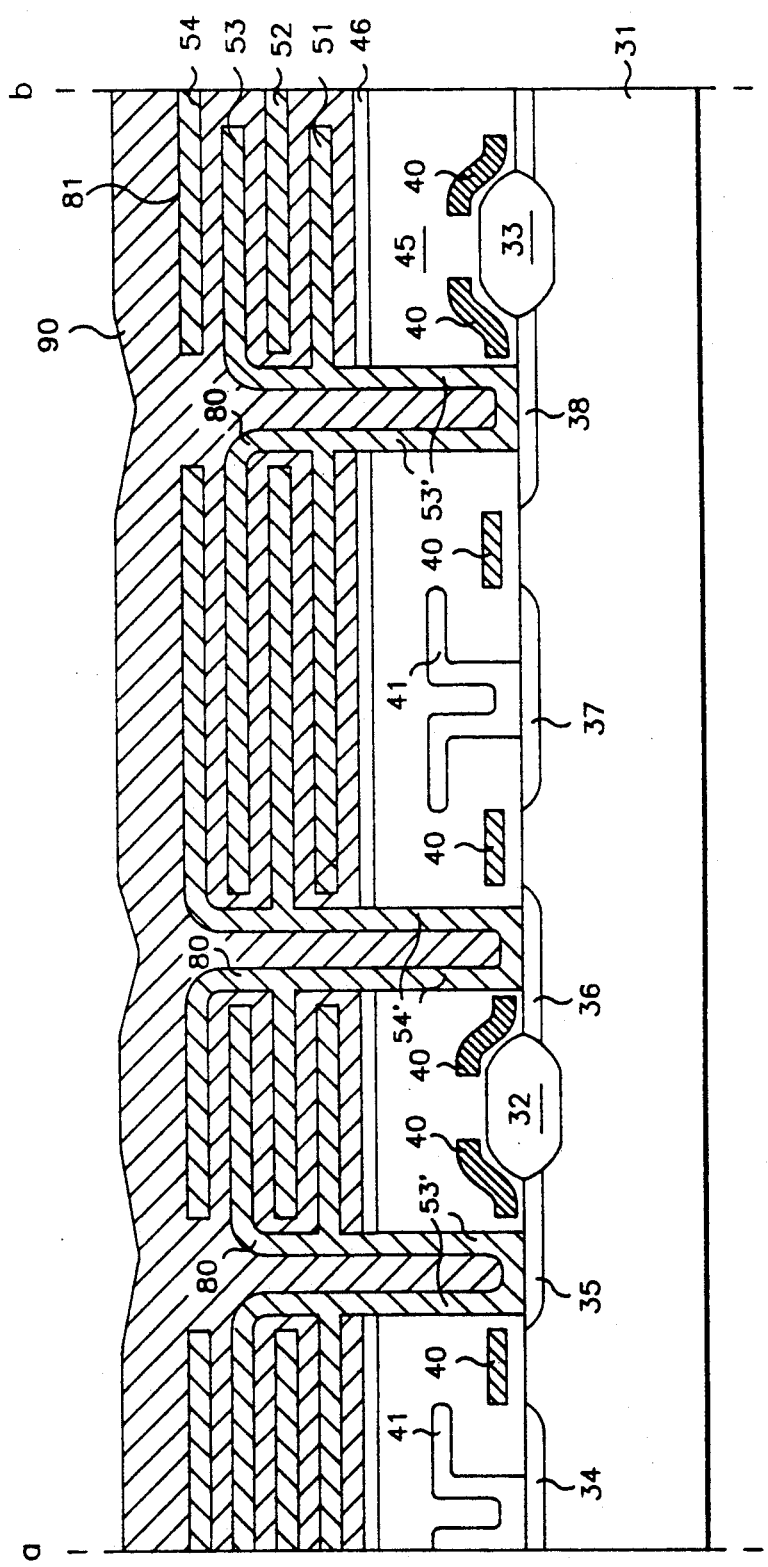
FIG. 3 is a cross sectional view according to line a—b of FIG. 2.

Referring to FIG. 3, over the semiconductor substrate 31 having element isolating oxide layers 32, 33, source regions 35, 36, 38, drain regions 34, 37, word line 40 and bit line 41 are successively laid a thick insulating interlayer 45 and a nitride layer 46. The portions of the insulating interlayer 45 and the nitride layer 46 positioned over the source regions 35, 36, 38 are removed to form contact openings 72, 73, 75 for connecting the source regions with the capacitor. The storage electrode 80 of the capacitor contacts the source regions 35, 36, 38 through the contact openings 72, 73, 75. Over the surface of the storage electrode 80 are successively laid dielectric layer 81 and plate electrode 90. The storage electrode 80 is fin-shaped with the wing portions thereof being interposed between the wing portions of the adjacent other storage electrodes. Namely, the storage electrode connected with the source region 36 includes a first polysilicon wall 54' connected to the source region 36 and extended vertically to the substrate, a fourth polysilicon layer 54 connected to the upper end of the first polysilicon wall 54' and extended in parallel with the substrate, and a second polysilicon layer 52 connected to the first polysilicon wall 54' below the fourth polysilicon layer 54 and extended in parallel with the substrate. Likewise, the storage electrode connected with another source region 38 adjacent to the source region 36 includes a second polysilicon wall 53' connected with the source region 38 and extended vertically to the substrate, a third polysilicon layer 53 connected to the upper end of the second polysilicon wall 53' and extended in parallel with the substrate between the fourth polysilicon layer 54 and the second polysilicon layer 52, and first polysilicon layer 51 connected to the second polysilicon wall 53' below the second polysilicon layer 52 and extended in parallel with the substrate.

Figure 4:
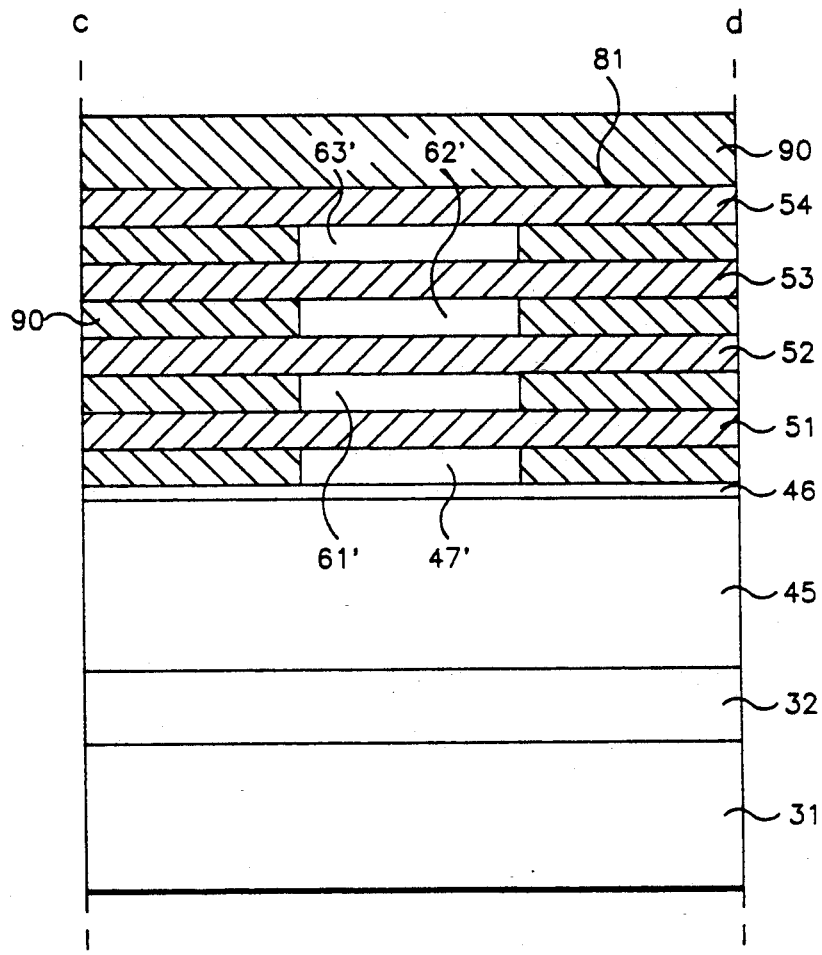
FIG. 4 is a cross sectional view according to line c—d of FIG. 2.

Meanwhile, although there is not shown in FIG. 3 the oxide layer 104 remaining between the polysilicon layers as shown in FIG. 2, referring to FIG. 4, over the semiconductor substrate 31 are successively laid element isolating oxide layer 32, insulating interlayer 45 and nitride layer 46, over which the first, second, third and fourth polysilicon layers 51, 52, 53, 54 are successively laid with first, second, third and fourth supporting layers 47', 61', 62', 63' interposed between the central regions thereof. Here, the first, second, third and fourth supporting layers are the same as the oxide layer 104 shown in FIG. 2. Dielectric layer 81 is laid over the surfaces of the polysilicon layers 51, 52, 53, 54 and the supporting layers 47', 61', 62', 63', over which in turn is laid plate electrode 90.

As shown in FIGS. 2, 3 and 4, it will be appreciated that the structure of the storage electrode of the inventive stacked capacitor includes a plurality of fin-shaped polysilicon layers stacked with supporting layers interposed therebetween to compensate for the weakness of the fin-shaped structure.

Hereinafter, the process for producing the inventive stacked capacitor will be described with reference to FIG. 5.

Figure 5A:
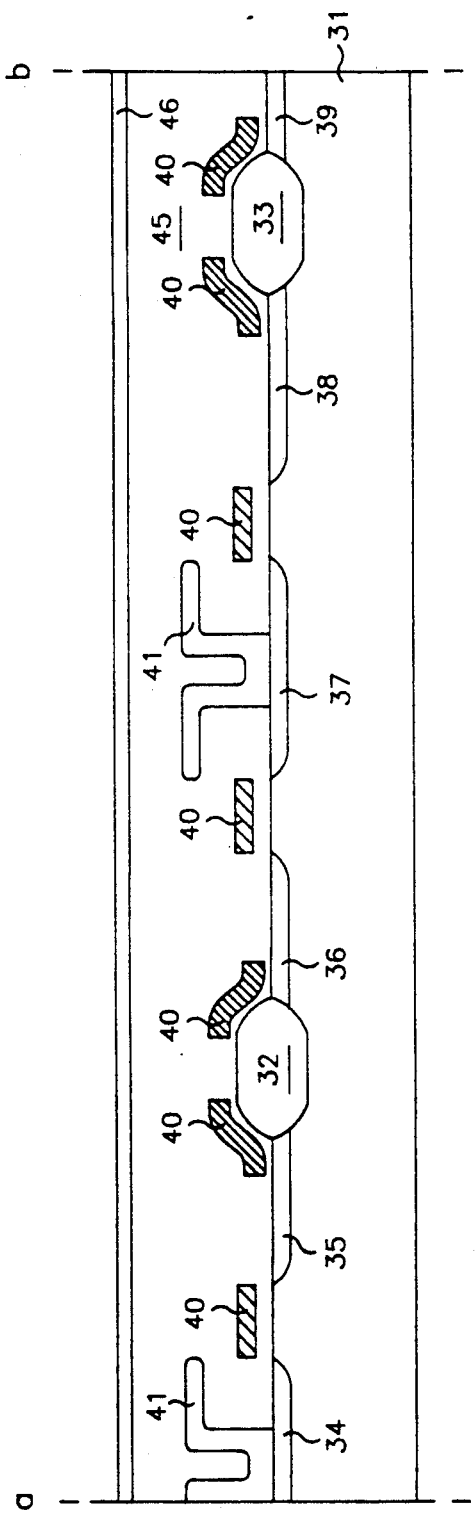
FIGS. 5A-5I illustrate the inventive process for making a stacked capacitor.

First, as shown in FIG. 5A, over the semiconductor substrate 31 having the element isolating oxide layers 32, 33, source regions 35, 36, 38, 39, drain regions 34, 37, word line 40 and bit line 41 are successively laid the insulating interlayer 45 and the nitride layer 46 of 1,000-2,0007Å thick to stop the etching in the following processing step. For description convenience, the portions indicated by the reference numerals 36 and 39 are referred to as first source region, and the reference numerals 35 and 38 as second source region.

Figure 5B:
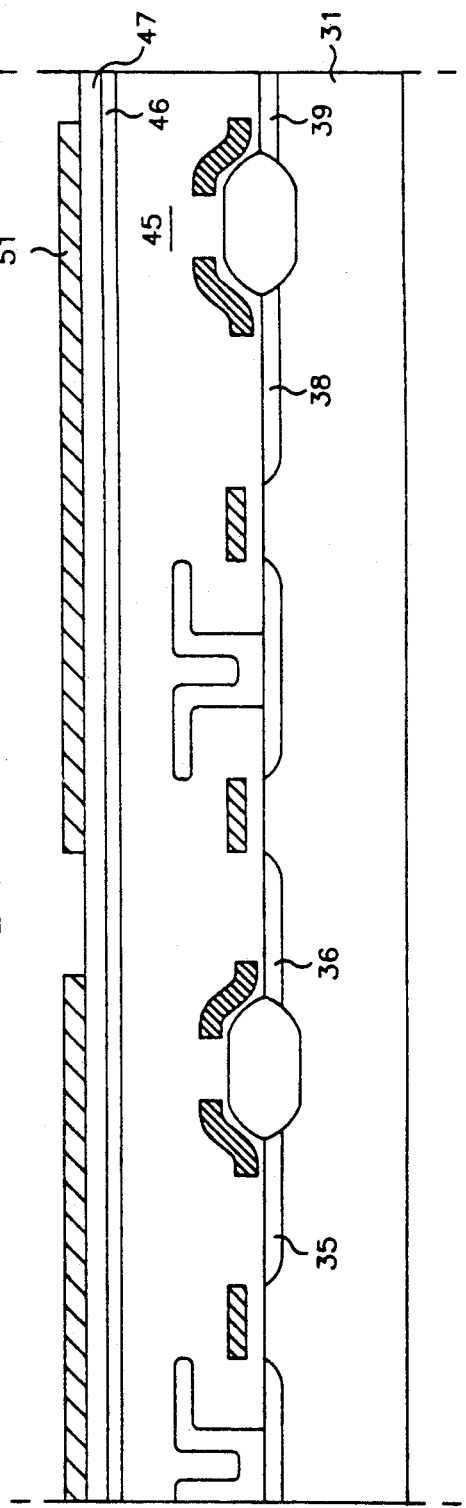
Figure 5C:
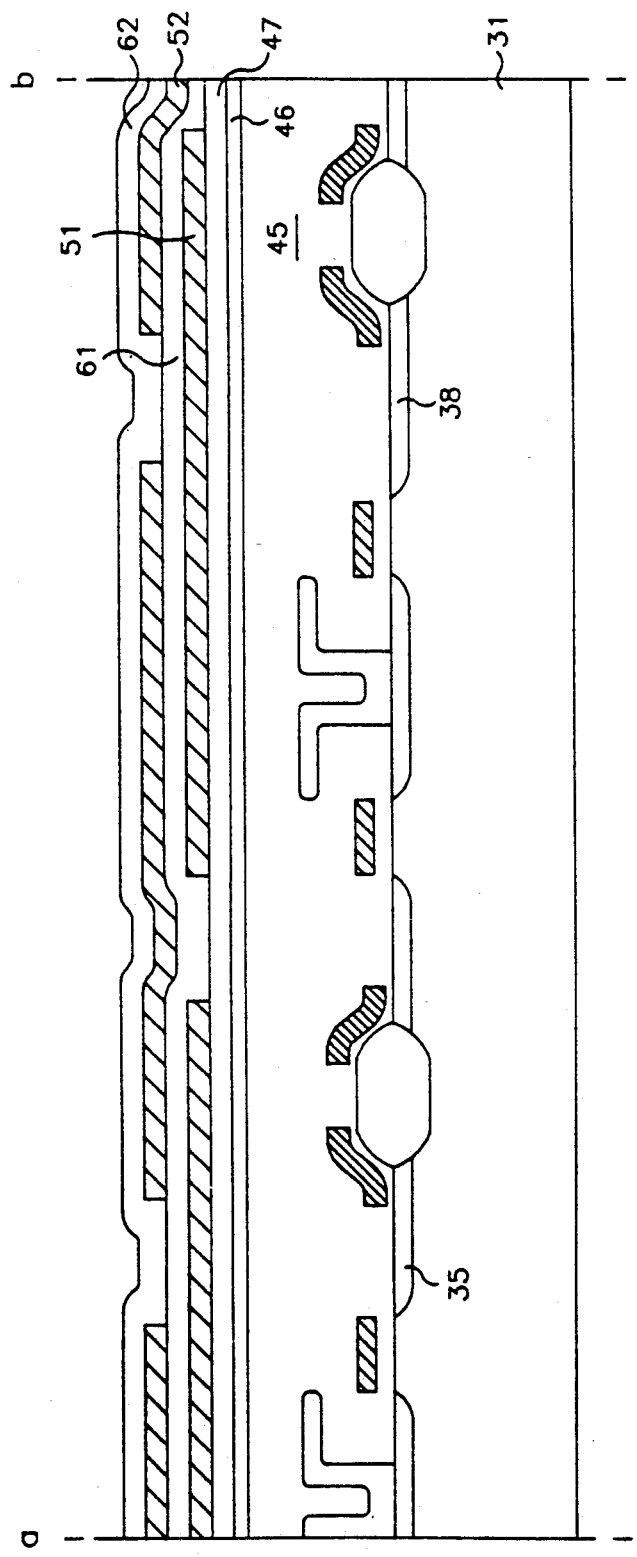

Then, as shown in FIG. 5B, over the surface of the nitride layer 45 are successively laid first oxide layer 47 of 1,000-4,000Å thick and first polysilicon layer 51 of 500-3,000Å thick. The portion of the first polysilicon layer 51 positioned above the first source region 36, 39 is selectively etched. The oxide layer and polysilicon layer which are formed thereafter are of the same thickness as those of the first oxide layer 47 and the first polysilicon layer 51. Subsequently, as shown in FIG. 5C, over the exposed surface of the first oxide layer 47 and the surface of the first polysilicon layer 51 are successively laid the second oxide layer 61 and the second polysilicon layer 52. The portion of the second polysilicon layer 52 positioned above the second source region 35, 38 is selectively etched, and then the third oxide layer 62 is laid over the whole surface of the substrate.

Figure 5D:
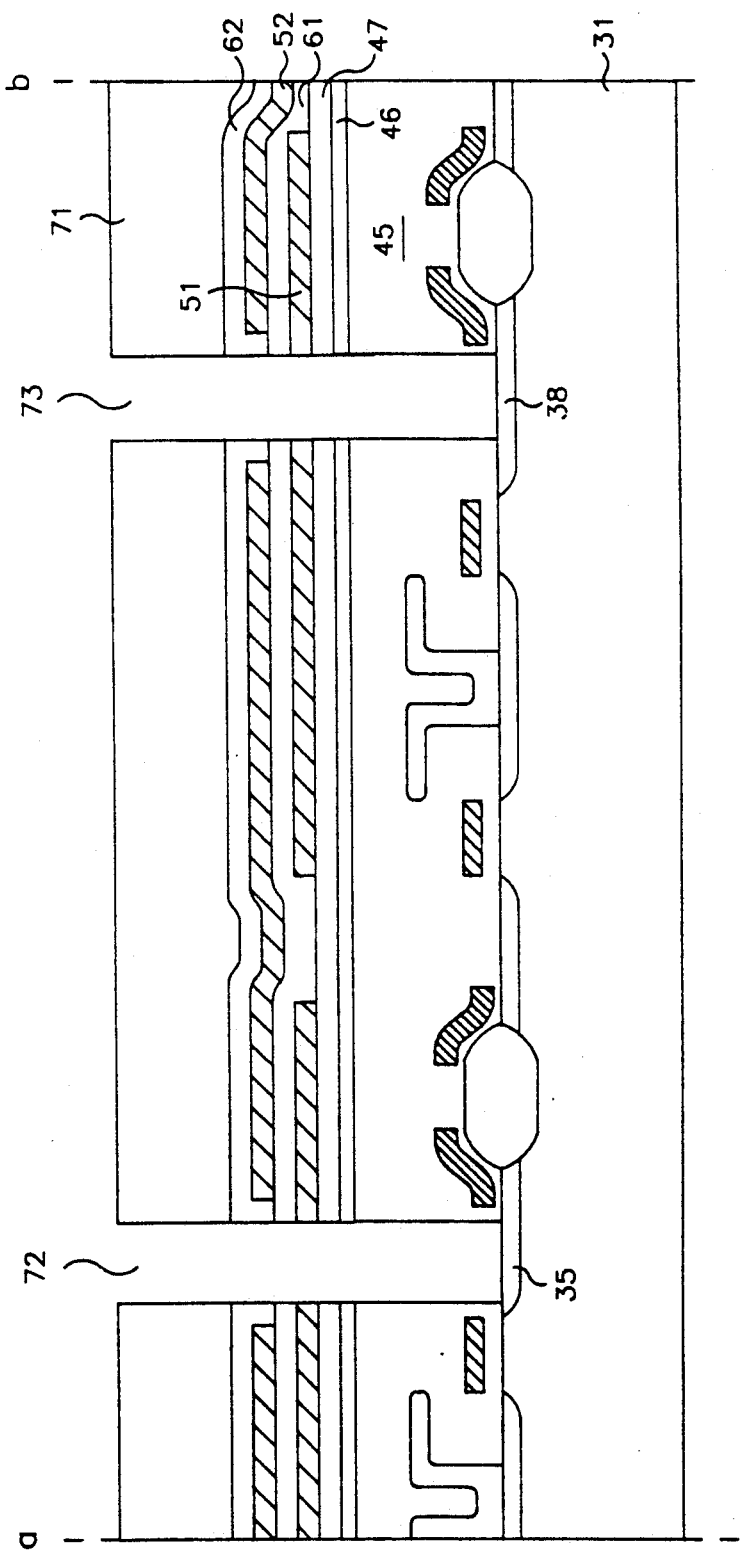
Figure 5E:
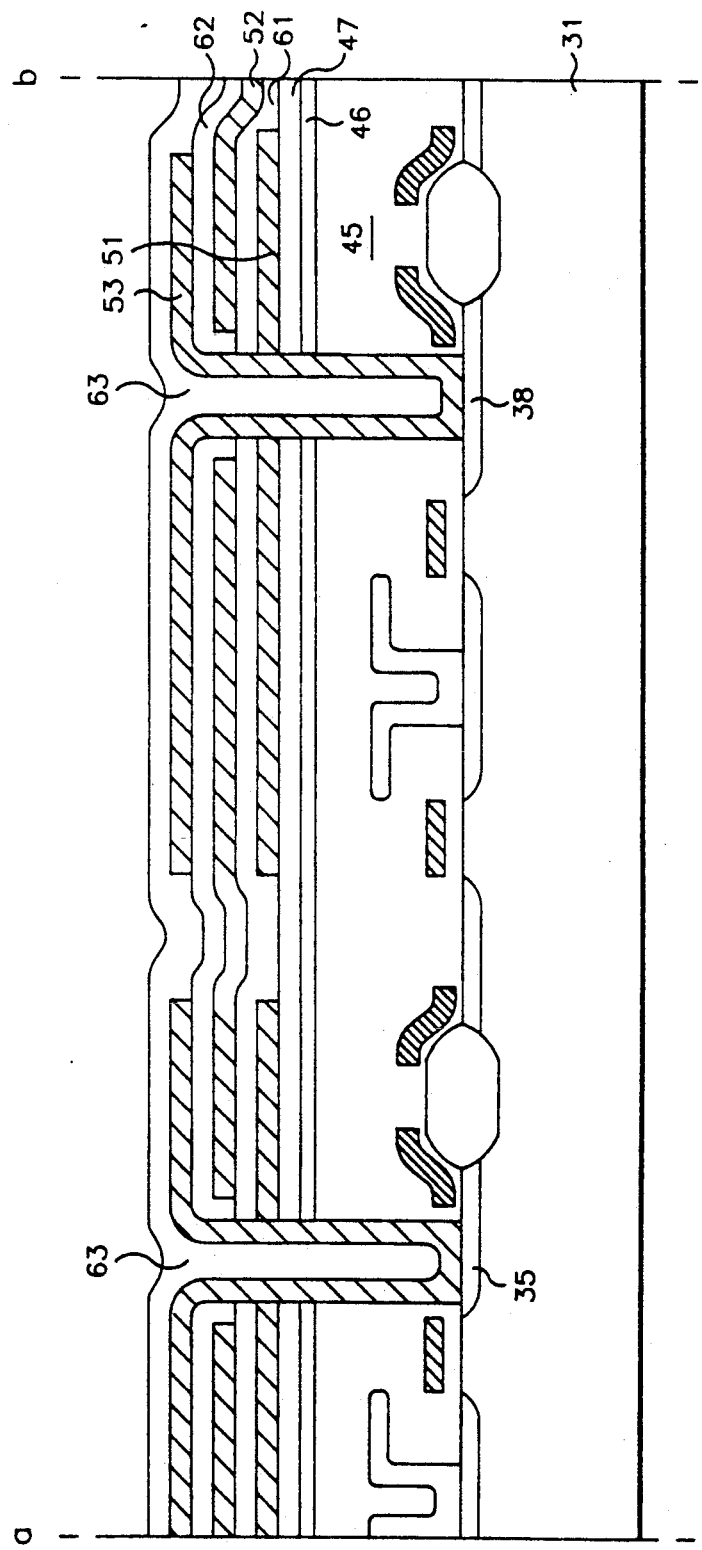

The first photoresist pattern 71, as shown in FIG. 5D, is laid over the third oxide layer to sequentially etch the portions of the third oxide layer 62, second oxide layer 61, first polysilicon layer 51, first oxide layer 47, nitride layer 46 and insulating interlayer 45 positioned above the second source regions 35, 38, thereby forming the first contact openings 72, 73 for exposing the surface of the second source regions 35, 38. Then, as shown in FIG. 5E, after the first photoresist pattern 71 is removed and the second polysilicon wall 53' with the third polysilicon layer is formed contacting the second source region 35, 38 and the first polysilicon layer 51, the fourth oxide layer 63 is laid over the whole surface of the substrate.

Figure 5F:
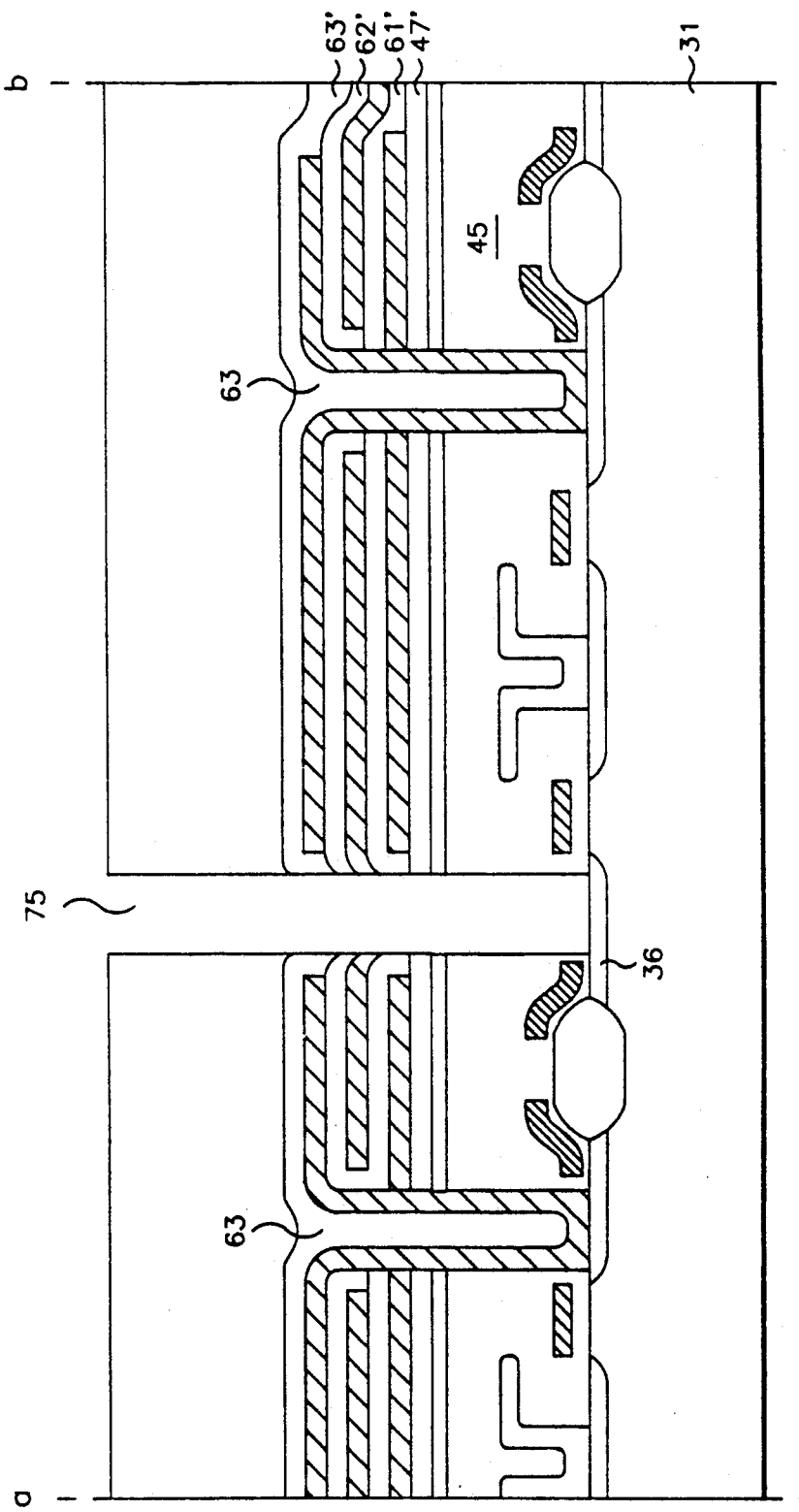

Then, as shown in FIG. 5F, the second photoresist pattern 74 is laid over the fourth oxide layer 63 to sequentially etch the portions of the fourth oxide layer 63, third oxide layer 62, second polysilicon layer 52, second oxide layer 61, first oxide layer 47, nitride layer 46 and insulating interlayer 45 positioned above the first source region 36, thereby forming the second contact opening for exposing the surface of the first source region.

Figure 5G:
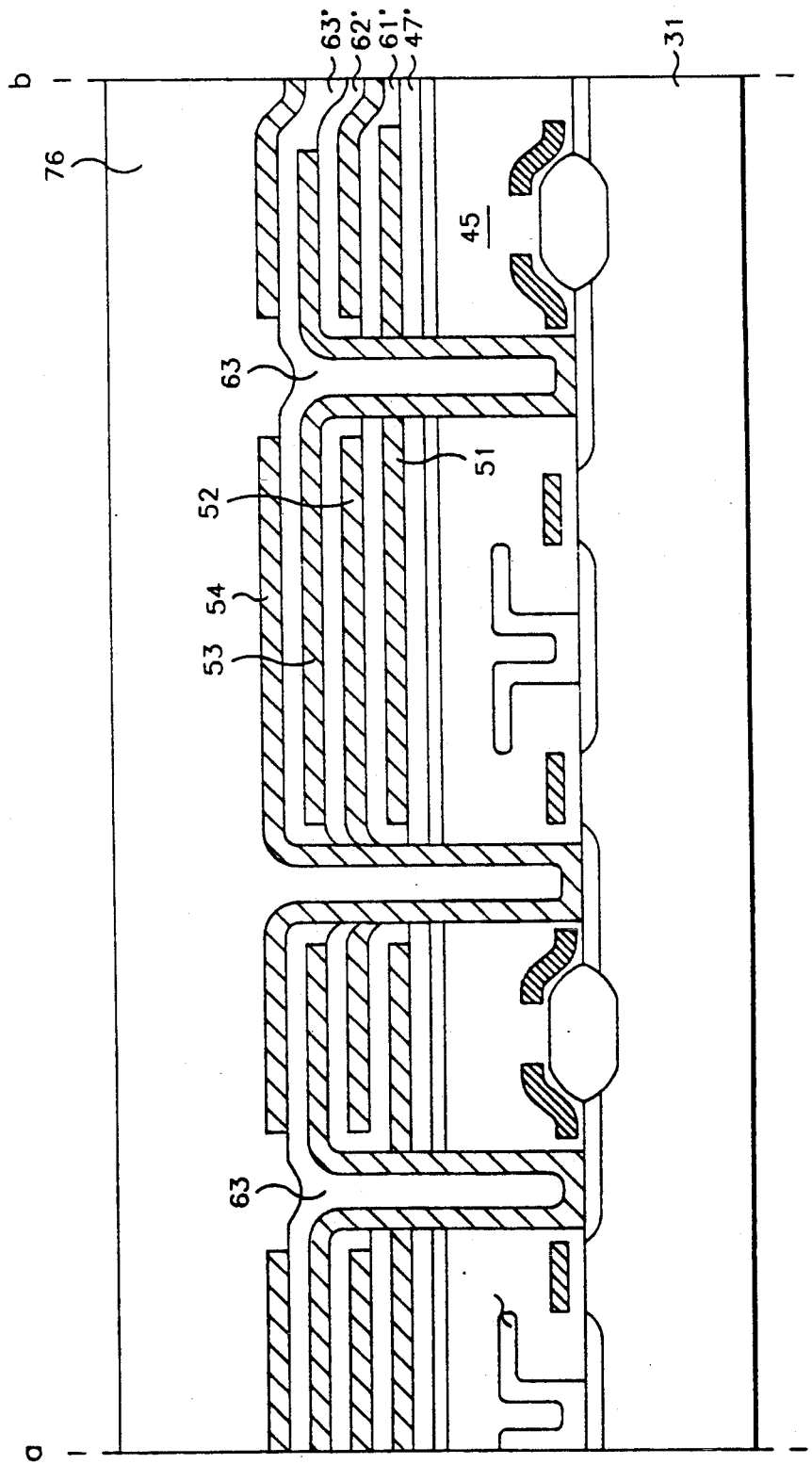

The third photoresist pattern 76, as shown in FIG. 5G, is laid over the whole surface of the substrate. The third photoresist pattern is the same as the photoresist pattern 76 shown in FIG. 2. The portion that is not covered by the third photoresist pattern 76 is etched until the nitride layer 46 is exposed (See FIG. 2). The nitride layer 46 serves to stop the etching process.

Figure 5H:
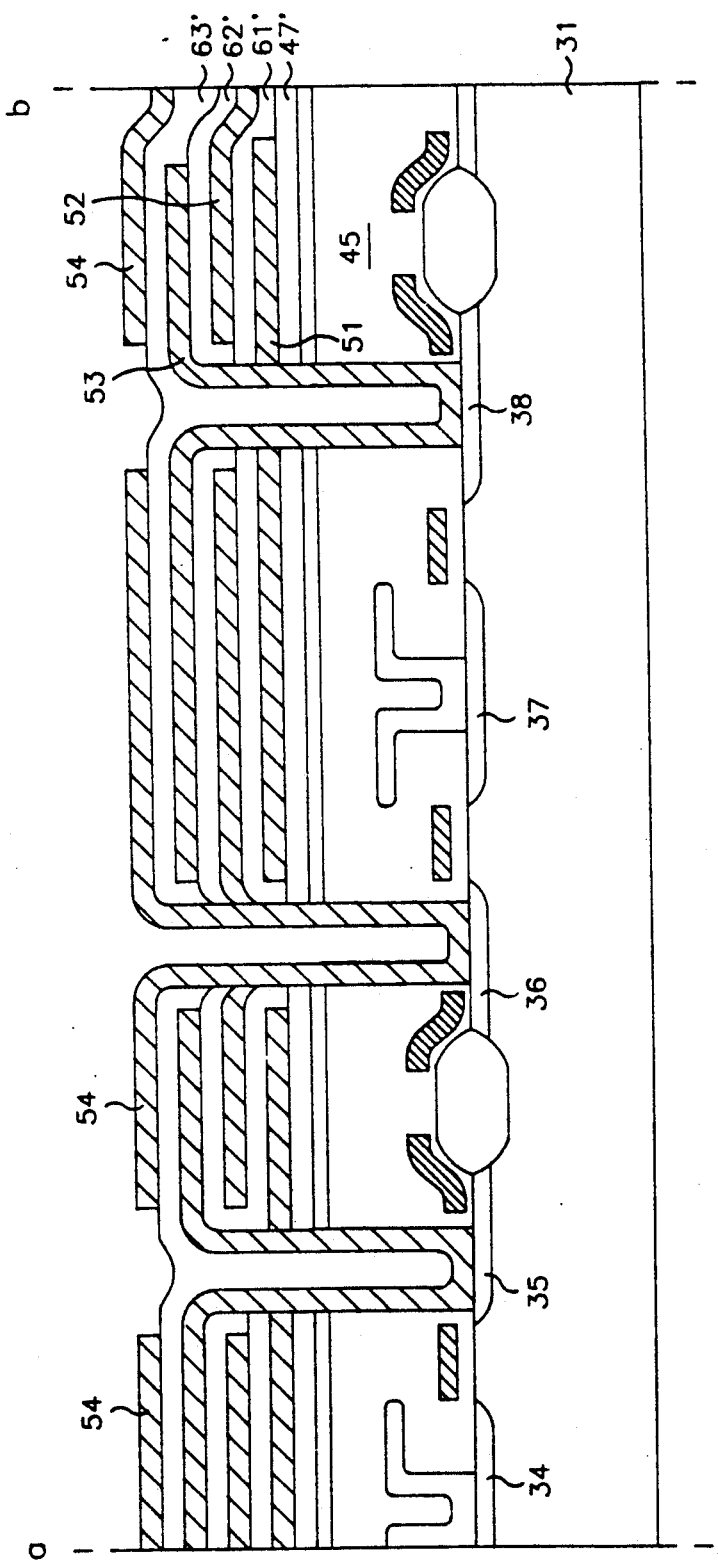
Figure 5I:
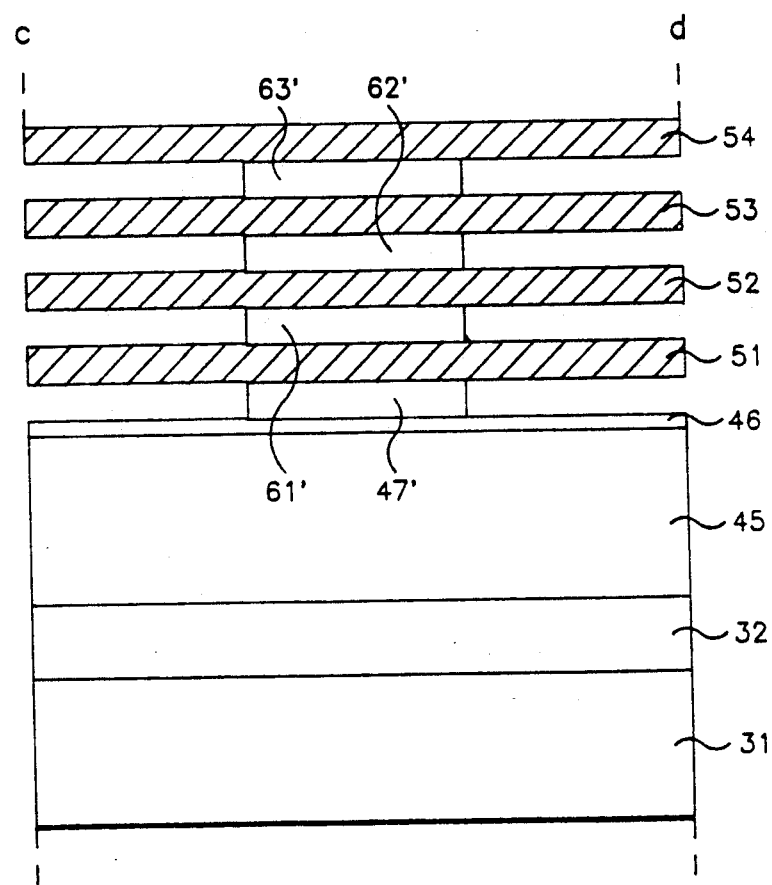

Subsequently, the semiconductor substrate 31 is immersed in a BOE (Buffered Oxide Etch) solution in the ratio of 7:1 ($NK_4F:HF$) for 3-4 minutes, or in a HF solution in the ratio of 100:1 ($H_2O:HF$) for 100-120 minutes, or subjected to the isotropic dry etching for a given time while maintaining the photoresist pattern 76, so as to etch about 4,500Å-4,700Å from exterior of the photoresist pattern 76 toward the interior of the first, second, third and fourth oxide layers 47, 61, 62, 63 below the photoresist pattern 76, thereby obtaining the structure as shown in FIG. 5H or 5I. As shown in FIGS. 5H and 5I, there are shown the first, second, third and fourth supporting layers 47', 61', 62', 63' formed by etching portions of the first, second, third and fourth oxide layers. The supporting layers are the same as the supporting layer 104 extended lengthwise below the central part of the third photoresist pattern 76 as shown in FIG. 2. In this embodiment, when the width of the photoresist pattern 76 is 0.5 μm thick, it is preferable for the thicknesses of above supporting layers to be of about 300-500Å. Then, the dielectric layer 81 is laid over the surfaces of the exposed first, second, third and fourth polysilicon layers 51, 52, 53, 54, and the first, second, third and fourth supporting layers 47', 61', 62', 63', and the fifth polysilicon layer 90 is deposited as the plate electrode on the whole surface of the substrate, thus completing the capacitor of the DRAM cell. The dielectric layer can be formed by means of the heat oxidation in an oxygen atmosphere or formed by means of ONO (Oxide-Nitride-Oxide) film of 30-50Å thick with a good dielectric feature.

Thus, according to the present invention, the supporting oxide layers are interposed between the polysilicon layers in order to compensate for the structural weakness of the wing portions of the fin-shaped storage electrodes as well as improving the processing reliability. Consequently, overcoming the limitations accompanying the increase of the capacity of the capacitor, there is provided a capacitor of a DRAM cell suitable for high integration and large capacity.

While the invention has been particularly shown and described with reference to a preferred embodiment, it will be understood by those skilled in the art that modifications in detail may be made without departing from the spirit and scope of the invention.

What is claimed is:

1. A semiconductor memory device having a first and a second conductive regions formed on a semiconductor substrate, comprising:

a first polysilicon wall vertically extended to said semiconductor substrate together with contacting said first conductive region;

a second polysilicon layer extended in parallel to said semiconductor substrate to a given distance together with contacting said first polysilicon wall;

a fourth polysilicon silicon layer extended in the same direction as said second polysilicon layer to a given distance together with contacting the upper end of said first polysilicon wall;

a second polysilicon wall vertically extended to said semiconductor substrate together with contacting said second conductive region;

a first polysilicon layer extended in the direction opposite to said second polysilicon layer below said second polysilicon layer to a given distance together with contacting said second polysilicon wall;

a third polysilicon layer extended in the same direction as said first polysilicon layer to a given distance between said second polysilicon layer and said fourth polysilicon layer together with contacting the upper end of said second polysilicon wall;

an insulating layer formed below said first polysilicon layer and between said first and second polysilicon walls;

a plurality of supporting layers extended lengthwise of said third polysilicon layer so as to fill parts of the gaps between said first, second, third and fourth polysilicon layers and said insulating layer;

a dielectric layer formed on the surfaces of said first and second polysilicon walls, said first, second, third and fourth polysilicon layers, and said supporting layers; and a fifth polysilicon layer covering the upper surface of said fourth polysilicon layer together with contacting the surface of said dielectric layer.

2. A semiconductor memory device as claimed in claim 1, wherein said first, second, third and fourth polysilicon layers have the same width and extension length, said extension length being within the distance between said first and second conductive regions.

3. A semiconductor memory device as claimed in claim 2, wherein said supporting layers comprises the silicon oxide, having the width at least equal to or smaller than the width of said first, second, third and fourth polysilicon layers.

4. A semiconductor memory device as claimed in claim 1, wherein said first polysilicon wall, and said second and fourth polysilicon layers, or said second silicon walls, and said first and third polysilicon layers serve the storage electrode of a capacitor.

5. A semiconductor memory device as claimed in claim 1, wherein said fifth polysilicon layer serves as a plate electrode of a capacitor.

6. A semiconductor memory device, comprising:
an insulating interlayer and a nitride layer sequentially deposited on a semiconductor substrate comprising an element isolating oxide layer, first and second source regions, drain region and gate electrode of a transistor, and bit line electrodes;

a first oxide layer disposed on a portion of said nitride layer;

a first polysilicon layer covering said first oxide layer except above said first source region;

a second oxide layer disposed on a portion of said first polysilicon layer;

a second polysilicon layer covering said second oxide layer except above said second source region;

a third oxide layer disposed on a portion of said second polysilicon layer;

a first contact opening, extending sequentially through portions of said third oxide layer, second oxide layer, first polysilicon layer, first oxide layer, nitride layer and insulating interlayer, positioned above said second source region;

a third polysilicon layer disposed on the inside of said first contact opening and the upper surface of said third oxide layer, except above said first source region;

a fourth oxide layer disposed on a portion of said third polysilicon layer;

a second contact opening, extending sequentially through said fourth oxide layer, third oxide layer, second polysilicon layer, second oxide layer, first oxide layer, nitride layer and insulating interlayer, positioned above said first source region; and a fourth polysilicon layer disposed on the inside of said second contact opening and the upper surface of said fourth oxide layer, except above said second source region;

wherein said first, second, third and fourth oxide layers form supporting layers respectively positioned below said first, second, third and fourth polysilicon layers.

7. A semiconductor device as claimed in claim 6, wherein said third polysilicon layer is connected to said first polysilicon layer.

8. A semiconductor device as claimed in claim 6, wherein said fourth polysilicon layer is connected to said second polysilicon layer.

9. A semiconductor device as claimed in claim 6, wherein said first, second, third and fourth layers insulate said second and fourth polysilicon layers starting at said first and third polysilicon layers.

10. A semiconductor device as claimed in claim 6, wherein said nitride layer serves as etching-preventive layer.

11. A semiconductor as claimed in claim 6, wherein said first, second, third and fourth oxide layers are are narrower widthwise than said first, second, third and fourth polysilicon layers, and respectively extend lengthwise centrally below said first, second, third and fourth polysilicon layers.

12. A semiconductor device as claimed in claim 6, further comprising:
a thin dielectric layer disposed on the exposed surfaces of said nitride layer, said supporting layers and said first, second, third and fourth polysilicon layers; and a fifth polysilicon layer disposed on the upper part of said semiconductor substrate including the surface of said dielectric layer;

wherein said first and third polysilicon layers or said second and fourth polysilicon layers serve as a storage electrode of a capacitor, and said fifth polysilicon layer serves as a plate electrode of said capacitor.

13. A semiconductor memory device having a plurality of transistors with respective source regions and a plurality of stacked capacitors, said plurality of stacked capacitors comprising:
a first polysilicon wall extending vertically through a first throughhole to contact a first source region;

a first polysilicon layer extending horizontally from said first polysilicon wall in a first direction;

a second polysilicon wall extending vertically through a second throughhole to contact a second source region;

a second polysilicon layer extending horizontally from said second polysilicon wall in a second direction opposite said first direction, above and in parallel to said first polysilicon layer;

a third polysilicon layer extending horizontally from said first polysilicon wall in said first direction;

a fourth polysilicon layer extending horizontally from said second polysilicon wall in said second direction above and in parallel to said third polysilicon layer;

a first plurality of oxide layers extending between said first and second polysilicon walls for supporting said first, second, third and fourth polysilicon layers; p1 a dielectric layer covering exposed surfaces of said first, second, third and fourth polysilicon layers, said first plurality of oxide layers and said first and second polysilicon walls; and a fifth polysilicon layer covering exposed surfaces of said dielectric layer, wherein said fifth polysilicon layer extends vertically into said first and second throughholes, between said first, second, third and fourth polysilicon layers and over said fourth polysilicon layer thereby covering said semiconductor device.

14. The semiconductor memory device as claimed in claim 13, wherein said plurality of stacked capacitors further comprise:

a third polysilicon wall extending vertically through said first throughhole to contact said first source region;

a fifth polysilicon layer extending horizontally from said third polysilicon wall in said second direction;

a fourth polysilicon wall extending vertically through said second throughhole to contact said second source region;

a sixth polysilicon layer extending horizontally from said fourth polysilicon wall in said first direction;

a seventh polysilicon layer extending horizontally from said third polysilicon wall in said second direction;

a eighth polysilicon layer extending horizontally from said fourth polysilicon wall in said first direction;

said dielectric layer covering exposed surfaces of said fifth, sixth, seventh and eighth polysilicon layers and said third and fourth polysilicon walls; and said fifth polysilicon layer extending between said fifth, sixth, seventh and eighth polysilicon layers and over said seventh and eighth polysilicon layers.

15. The semiconductor memory device as claimed in claim 14, wherein said plurality of stacked capacitors further comprise:

a third source region and a fourth source region;

a first isolating region for isolating said first source region from said third source region;

a second isolating region for isolating said second source region from said fourth source region;

a fifth polysilicon wall extending vertically through a third throughhole to contact said third source region;

a ninth polysilicon layer extending horizontally from said fifth polysilicon wall in said first direction above and in parallel to said fifth polysilicon layer;

a sixth polysilicon wall extending vertically through a fourth throughhole to contact said fourth source region;

a tenth polysilicon layer extending horizontally from said sixth polysilicon wall in said second direction below and in parallel to said sixth polysilicon layer;

an eleventh polysilicon layer extending horizontally from said fifth polysilicon wall in said first direction above and in parallel to said seventh polysilicon layer;

a twelfth polysilicon layer extending horizontally from said sixth polysilicon wall in said second direction below and in parallel to said eight polysilicon layer;

a second plurality of oxide layers extending between said third and fifth polysilicon walls for supporting said fifth, seventh, ninth and eleventh polysilicon layers;

a third plurality of oxide layers extending between said fourth and sixth polysilicon walls for supporting said sixth, eighth, tenth and twelfth polysilicon layers;

said dielectric layer covering exposed surfaces of said ninth, tenth, eleventh and twelfth polysilicon layers, said second and third plurality of oxide layers and said fifth and sixth polysilicon walls; and said fifth polysilicon layer extending vertically into said third and fourth throughholes and covering said dielectric layer thereby covering said semiconductor device.

16. The semiconductor memory device as claimed in claim 13, wherein;

said polysilicon wall, and said first and third polysilicon layers form a storage electrode of first one of said plurality of stacked capacitors;

said second polysilicon wall, and said second and fourth polysilicon layers form a storage electrode of a second one of said plurality of stacked capacitors; and said fifth polysilicon layer comprises a plate electrode for said plurality of stacked capacitors.

17. The semiconductor memory device as claimed in claim 15, wherein said fifth polysilicon layer forms a plate electrode for said plurality of stacked capacitors.

* * * * *

UNITED STATES PATENT AND TRADEMARK OFFICE
CERTIFICATE OF CORRECTION

PATENT NO. : 5,187,548
DATED : February 16, 1993
INVENTOR(S) : Won-Shik Baek, et al.

It is certified that error appears in the above-indentified patent and that said Letters Patent is hereby corrected as shown below:

Claim 6, column 6, line 17, insert --of-- after "through"
Claim 13, column 7, line 17, change "ers;pl a" to --ers;--

Signed and Sealed this

Nineteenth Day of July, 1994

Attest:

BRUCE LEHMAN

*Attesting Officer*   Commissioner of Patents and Trademarks